United States Patent
Dobashi et al.

(10) Patent No.: US 9,960,056 B2
(45) Date of Patent: May 1, 2018

(54) SUBSTRATE CLEANING METHOD, SUBSTRATE CLEANING APPARATUS AND VACUUM PROCESSING SYSTEM

(71) Applicant: Tokyo Electron Limited, Tokyo (JP)

(72) Inventors: Kazuya Dobashi, Nirasaki (JP); Kensuke Inai, Nirasaki (JP); Misako Saito, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 163 days.

(21) Appl. No.: 14/430,760

(22) PCT Filed: Aug. 28, 2013

(86) PCT No.: PCT/JP2013/005079
§ 371 (c)(1),
(2) Date: Mar. 24, 2015

(87) PCT Pub. No.: WO2014/049959
PCT Pub. Date: Apr. 3, 2014

(65) Prior Publication Data
US 2015/0255316 A1    Sep. 10, 2015

(30) Foreign Application Priority Data
Sep. 28, 2012  (JP) .................. 2012-217539

(51) Int. Cl.
*H01L 21/67*    (2006.01)
*H01L 21/02*    (2006.01)
(Continued)

(52) U.S. Cl.
CPC .......... *H01L 21/67051* (2013.01); *B08B 5/02* (2013.01); *B08B 13/00* (2013.01);
(Continued)

(58) Field of Classification Search
None
See application file for complete search history.

(56) References Cited

U.S. PATENT DOCUMENTS

| | | | |
|---|---|---|---|
| 8,012,411 B1 * | 9/2011 | Betty | A62D 3/38 422/306 |
| 2003/0005949 A1 * | 1/2003 | Yoshida | B08B 3/02 134/34 |

(Continued)

FOREIGN PATENT DOCUMENTS

| | | |
|---|---|---|
| JP | 2007-232901 | 9/2007 |
| JP | 2011-171584 | 9/2011 |

(Continued)

OTHER PUBLICATIONS

English Machine Translation of JP 2011-171584.*
English Machine Translation of WO 2011-115157.*
The International Search Report dated Nov. 26, 2013.

*Primary Examiner* — Nicole Blan

(57) ABSTRACT

In order to remove a deposit adhered to the backside of the peripheral portion of a wafer, a cleaning gas containing carbon dioxide gas is set to a pressure that is slightly lower than the pressure corresponding to a vapor pressure line of carbon dioxide at a temperature in the nozzle, and a gas cluster of carbon dioxide is generated. A gas cluster of carbon dioxide generated under such a condition is in a state immediately prior to undergoing a phase change to a liquid and therefore is a gas cluster having a large cluster diameter and having molecules that are firmly solidified.

15 Claims, 16 Drawing Sheets

(51) Int. Cl.
 *B08B 5/02* (2006.01)
 *B08B 13/00* (2006.01)
(52) U.S. Cl.
 CPC .... *H01L 21/0209* (2013.01); *H01L 21/02087*
  (2013.01); *H01L 21/67028* (2013.01)

(56) References Cited

U.S. PATENT DOCUMENTS

| | | | |
|---|---|---|---|
| 2003/0230322 A1* | 12/2003 | Hillman | C23C 16/4408 134/11 |
| 2006/0102207 A1* | 5/2006 | Moriya | B08B 7/0021 134/34 |
| 2007/0202446 A1 | 8/2007 | Takahashi et al. | |
| 2008/0196742 A1* | 8/2008 | Beck | C11D 3/06 134/1.3 |
| 2008/0236627 A1* | 10/2008 | Kominami | B08B 3/041 134/18 |
| 2010/0025365 A1* | 2/2010 | Tabat | C23C 16/04 216/37 |
| 2010/0072173 A1* | 3/2010 | Hautala | B44C 1/227 216/94 |
| 2011/0147896 A1 | 6/2011 | Koike et al. | |
| 2012/0132827 A1 | 5/2012 | Fukuda et al. | |
| 2013/0008470 A1 | 1/2013 | Dobashi et al. | |
| 2013/0056033 A1 | 3/2013 | Matsui et al. | |

FOREIGN PATENT DOCUMENTS

| | | | |
|---|---|---|---|
| JP | 2012-119065 | 6/2012 | |
| KR | 10-2012-0030000 | 3/2012 | |
| WO | 2010/021265 | 2/2010 | |
| WO | 2011/115155 | 9/2011 | |
| WO | WO 2011115157 A1 * | 9/2011 | ............ G03F 7/422 |

* cited by examiner

US 9,960,056 B2

SUBSTRATE CLEANING METHOD, SUBSTRATE CLEANING APPARATUS AND VACUUM PROCESSING SYSTEM

CROSS-REFERENCE TO RELATED APPLICATIONS

This application is a national stage application of PCT Application No. PCT/JP2013/005079, filed on Aug. 28, 2013, and claims priority to and benefit of the Japanese Patent Application No. 2012-217539, filed on Sep. 28, 2012. The entire contents of the foregoing patent applications are incorporated herein by reference in entirety.

FIELD OF THE INVENTION

The present invention relates to a technique for cleaning a peripheral portion or a backside of a substrate.

BACKGROUND OF THE INVENTION

In a semiconductor device manufacturing process, there has been known a process of forming a hole or a trench in a multilayer film formed on a semiconductor wafer (hereinafter, referred to as "wafer") through a resist mask formed on the multilayer film by an etching gas suitable for each film by using a single etching apparatus. However, a deposit may be deposited to a peripheral portion or a backside of the wafer during the above process. This is because an etching residue is adhered to the wafer in a dry etching process and a film forming gas flows toward the backside of the wafer in a film forming process. The deposit may cause particles when the wafer is transferred or processed in a next process. Therefore, the deposit needs to be removed. As for a method for cleaning a deposit firmly adhered to the peripheral portion of the wafer, brush cleaning using a resin material, CMP (Chemical Mechanical Polishing) or the like has been conventionally used. However, such a method is mechanical and may cause secondary contamination from the cleaning members. Further, water is used for the cleaning, so that an adverse effect from water may be caused. In other words, if a thin film on the wafer is made of a soluble material, elution may occur or a low dielectric film such as SiCOH or the like may be damaged.

International Publication No. 2010/021265 discloses a technique for etching or planarizing a semiconductor substrate or a thin film layer on a surface of the semiconductor substrate by ejecting a gas cluster to the semiconductor substrate without ionizing the gas cluster. However, a technique for cleaning a peripheral portion of a wafer is not disclosed therein.

Further, Japanese Patent Application Publication No. 2007-232901 discloses a technique for removing a photoresist film by ejecting particles of dry ice toward a wafer. However, when the particles of the dry ice are ejected to the wafer to remove a polymer adhered to the wafer W, the wafer may be broken or secondary contamination from the dry ice may occur.

SUMMARY OF THE INVENTION

In view of the above, the present invention provides a technique capable of cleaning a deposit adhered to a peripheral portion or a backside of a substrate while suppressing adverse effect on the substrate.

In accordance with an aspect of the present invention, there is provided a substrate cleaning method for removing a deposit adhered to a backside or a peripheral portion of a substrate. The substrate cleaning method includes: supporting a substrate by a support; generating a gas cluster as an aggregate of atoms or molecules of carbon dioxide gas by adiabatic expansion, by ejecting a cleaning gas containing the carbon dioxide gas to a processing atmosphere from a nozzle unit in which a pressure is set to be higher than a pressure of the processing atmosphere where a substrate is provided; and removing the deposit by ejecting the gas cluster to the backside or the peripheral portion of the substrate. The pressure inside the nozzle unit is set to a pressure slightly lower than a pressure on a vapor pressure line of carbon dioxide at a temperature of the cleaning gas in the nozzle unit, at which a firm gas cluster of the carbon dioxide gas is generated.

In accordance with another aspect of the present invention, there is provided a substrate cleaning apparatus including: a support provided in a processing chamber having a gas exhaust port to support a substrate; a nozzle unit configured to eject a gas cluster to a backside or a peripheral portion of the substrate to remove a deposit adhered to the backside or the peripheral portion of the substrate supported by the support; a gas supply unit configured to supply a cleaning gas containing carbon dioxide gas to the nozzle unit; a pressure controller configured to control a pressure in the nozzle unit; and a moving mechanism configured to relatively move the nozzle unit and the support. A pressure inside the nozzle unit is set to a pressure slightly lower than a pressure on a vapor pressure line of carbon dioxide at a temperature of the cleaning gas in the nozzle unit, at which a firm gas cluster of the carbon dioxide is generated.

In accordance with still another aspect of the present invention, there is provided a vacuum processing system including: a vacuum transfer chamber configured to transfer a substrate under a vacuum atmosphere; a vacuum processing module connected to the vacuum transfer chamber through a partition valve and configured to perform vacuum processing on the substrate; and the substrate cleaning apparatus connected to the vacuum transfer chamber through a partition valve and configured to clean at least one of the backside and the peripheral portion of the substrate that has been subjected to the vacuum processing in the vacuum processing module.

EFFECT OF THE INVENTION

The present invention generates a gas cluster of carbon dioxide (aggregate of carbon dioxide molecules) by setting a cleaning gas containing carbon dioxide gas to a pressure slightly lower than a pressure on a vapor pressure line of carbon dioxide at a temperature in the nozzle unit. The gas cluster of carbon dioxide generated under such a condition is in a state immediately prior to undergoing a phase change to a liquid. Therefore, the gas cluster has a large cluster diameter (the number of molecules forming the cluster is large) and contains molecules that are firmly solidified. Accordingly, when the gas cluster is ejected to a peripheral portion or a backside of the substrate, a strong cleaning force is exerted. As a result, it is possible to effectively remove a deposit and perform the cleaning locally, which prevents the surface of the substrate (surface to be processed on which a desired process for forming an integrated circuit or the like is performed) from being damaged.

DETAILED DESCRIPTION OF THE EMBODIMENTS

A substrate processing method in accordance with the present invention is a method for generating a gas cluster by converting carbon dioxide ($CO_2$) into a cluster, ejecting the generated gas cluster to a peripheral portion or a backside of a substrate to remove a deposit therefrom.

Hereinafter, a gas cluster generation process will be described. First, $CO_2$ gas is compressed at a pressure of a few MPa, e.g., about 5 MPa. The gas in a high-pressure state is discharged to a vacuum atmosphere through, e.g., an orifice. The discharged $CO_2$ gas is expanded at once, so that a temperature thereof becomes lower than a condensation temperature by the adiabatic expansion. The condensed molecules are bonded by a Van der Waals force. As a result, a gas cluster that is an aggregate of $CO_2$ molecules is generated. $CO_2$ gas is used for the following reasons. $CO_2$ gas has a specific heat ratio γ of about 1.29 and Ar has a specific heat ratio γ of about 1.67, for example. Kinetic energy K per a single molecule of a gas cluster is expressed by an equation $K=\gamma/(\gamma-1) \times K_B \times T_0$. $K_B$ represents a voltzmann constant and $T_0$ represents a gas temperature.

From the above equation, when the gas temperature is 27° C., the kinetic energy per a single molecule of $CO_2$ becomes 115 meV and the kinetic energy per a single molecule of Ar becomes 64.6 meV. Since $CO_2$ gas has a higher kinetic energy per a single molecule, a gas cluster having a higher physical energy can be generated. A pressure in the nozzle unit 6 (a primary pressure of an orifice as an injection opening of the nozzle unit 6) for generating a gas cluster, i.e., a pressure before $CO_2$ gas is adiabatically expanded, is slightly lower than a pressure on a vapor pressure line (gas-liquid boundary line) at a temperature of the $CO_2$ gas. At such a pressure, a firm gas cluster is obtained. This pressure will be defined later.

Figure 1:
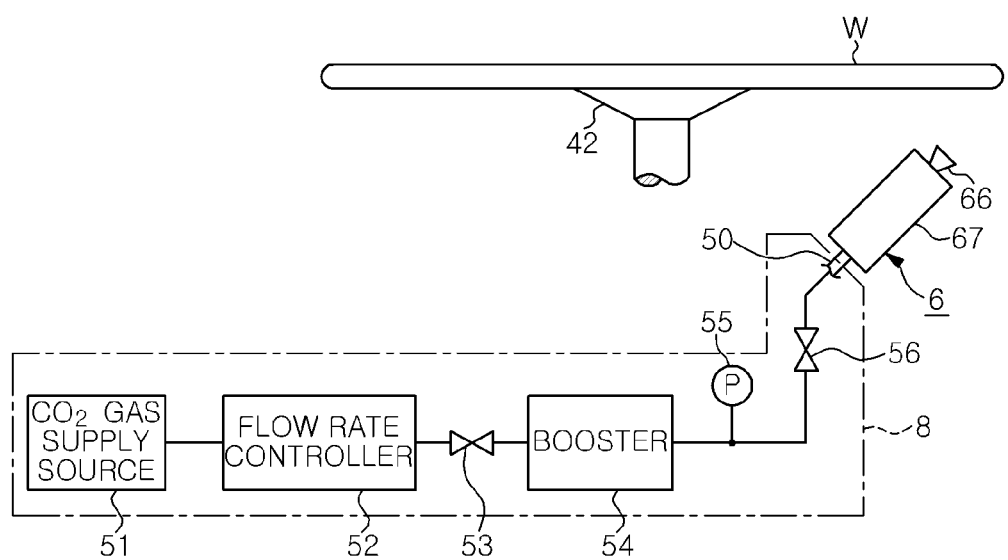
FIG. 1 shows an arrangement for a cleaning method in accordance with an embodiment of the present invention.

FIG. 1 shows an embodiment in accordance with the present invention. In the substrate cleaning method of the present invention, there is employed a rotating stage 42 serving as a support for supporting a wafer W, for example. The rotating stage 42 is configured as, e.g., an electrostatic chuck, and supports the wafer W horizontally while attracting a central portion of a backside of the wafer W. A nozzle unit 6 for generating a cluster is provided at a position corresponding to the backside of the wafer W on the rotating stage 42. The nozzle unit 6 includes a cylindrical pressure chamber 67. The injection opening 66 is formed at a leading end portion of the nozzle unit 6.

An orifice is formed at a base end portion of the injection opening 66. The injection opening 66 is widened toward the leading end portion in a trumpet shape. A gas supply line 50 that is a pipe is connected to a base end side of the nozzle unit 6. The gas supply line 50 is connected to a $CO_2$ gas supply source 51 and constitutes a gas supply unit. The gas supply unit includes the $CO_2$ gas supply source 51, a flow rate controller 52, a valve 53, a booster 54, a pressure gauge 55 and a valve 56 which are installed from an upstream side. These components constitute a cleaning gas supply system 8. A pressure in the pressure chamber 67 is controlled by controlling a flow rate of $CO_2$ gas supplied from the $CO_2$ gas supply source 51 by the flow rate controller 52 based on a detection value of the pressure guage 55.

Figure 2:
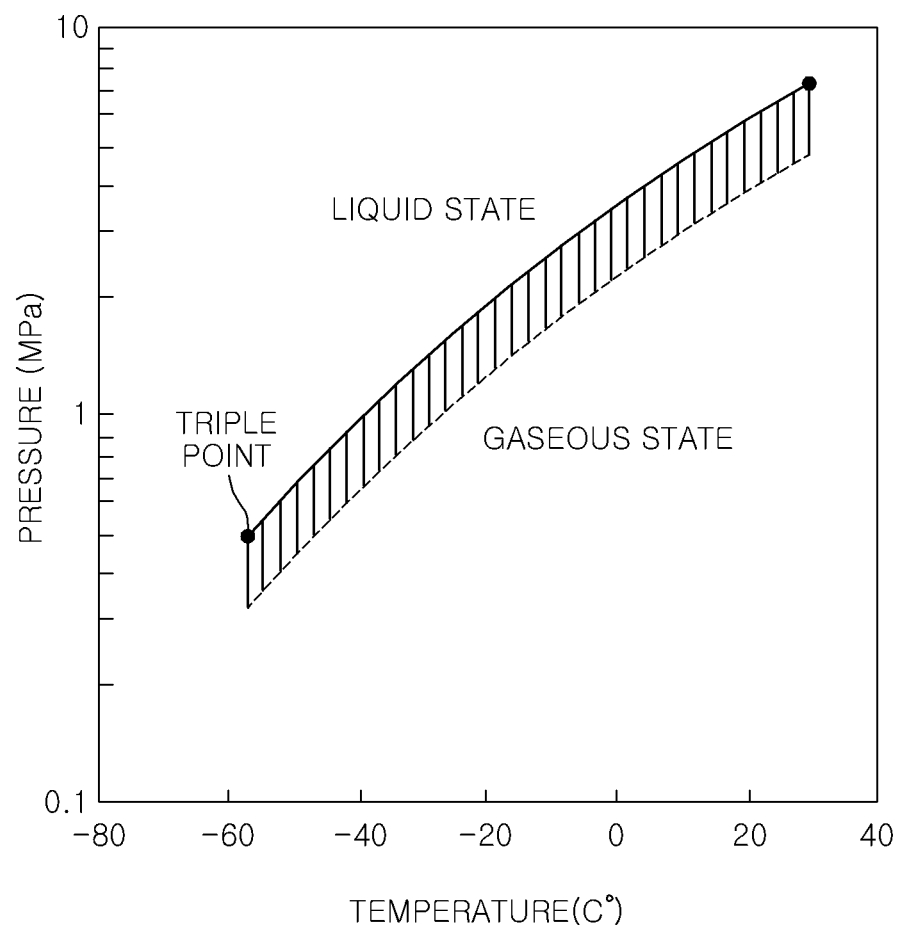
FIG. 2 is a graph describing the characteristics of a gas-liquid boundary curve of carbon dioxide.

Hereinafter, a pressure of $CO_2$ for generating a gas cluster will be described with reference to FIG. 2. FIG. 2 shows a vapor pressure line (gas-liquid boundary line) of $CO_2$. $CO_2$ is in a liquid state at an upper region of the vapor pressure line and in a gaseous state at a lower region of the vapor pressure line. A supercritical state of $CO_2$ occurs at a region where a pressure is 7.38 MPa or above and a temperature is 31.1° C. or above. A triple point occurs at a pressure of 0.52 MPa and a temperature of −56.6° C. A pressure of $CO_2$ gas on a primary side of an orifice of the present invention is set to a pressure slightly lower than a pressure on the vapor pressure line at a temperature of the $CO_2$ gas, i.e., a pressure at which a firm gas cluster is obtained. The $CO_2$ gas that is set to such a pressure is in a state immediately prior to undergoing a phase change from gas to liquid. Therefore, the gas cluster of $CO_2$ has a large cluster diameter (the number of molecules forming the cluster is large) and contains molecule that are firmly solidified. Accordingly, the gas cluster can apply strong impact to a target object.

A firm gas cluster of $CO_2$ can collapse a rectangular polysilicon pattern having a height of 100 nm, a width of 45 nm and a length of 600 nm, which is formed on a surface of a bare silicon wafer, for example. On the other hand, a gas cluster of $CO_2$ generated at a pressure much lower than the pressure on the vapor pressure line, e.g., by 25% or more cannot collapse the pattern.

In a test example to be described later, relation between a pressure and presence or absence of pattern collapse was obtained by ejecting a gas cluster to an actual pattern group while varying a pressure in the nozzle unit 6. It is possible to clearly determine from the result whether or not a gas cluster is firm. In other words, as can be seen from the presence or the absence of the pattern collapse, a firm gas cluster and a gas cluster that is generated at a pressure considerably lower than the pressure on the vapor pressure line and cannot be said to be firm have different impact forces and thus have considerably different cleaning capability. This indicates that the pressure slightly lower than the pressure on the vapor pressure line at the temperature of $CO_2$ gas, i.e., the pressure at which a firm gas cluster is obtained, can be clearly distinguished from a pressure lower than a minimum level of the pressure at which a firm gas cluster is obtained by ejecting each gas cluster to, e.g., a pattern or the like. Thus, the pressure slightly lower than the pressure on the vapor pressure line can be clearly determined.

Specifically, the pressure slightly lower than the pressure on the vapor pressure line is higher than at least 75% of the pressure on the vapor pressure line. In such a pressure range, a firm gas cluster is generated. In FIG. 2, the range of "the slightly lower pressure" is illustrated as a shaded region.

Figure 3:
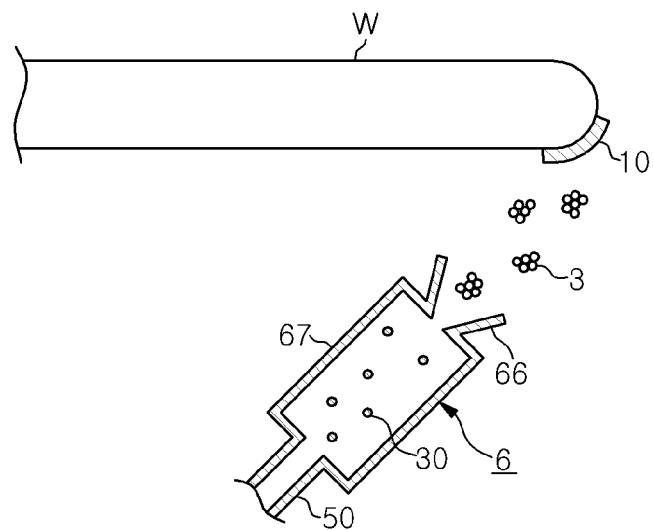
FIG. 3 is an explanatory view showing a process of removing a deposit from a peripheral portion of a substrate by a gas cluster.
Figure 4:
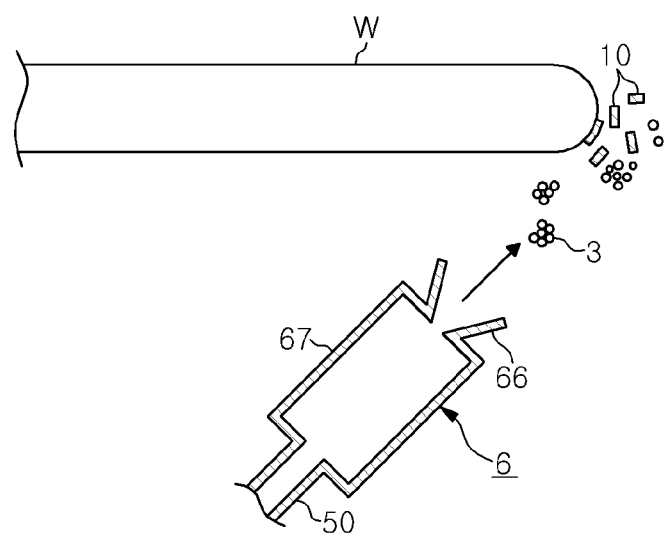
FIG. 4 is an explanatory view showing a process of removing the deposit from the peripheral portion of the substrate by the gas cluster.

As shown in FIG. 3, the gas cluster thus generated is ejected from the nozzle unit 6 in an axis direction of the nozzle unit 6 and collides with the deposit 10 adhered to the peripheral portion of the wafer W at an inclined angle of about 45°, for example, with respect to the surface of the wafer W. Accordingly, as shown in FIG. 4, the gas cluster 3 is decomposed to individual $CO_2$ molecules and the deposit 10 is broken and peeled by the impacts of the collision of the gas cluster 3 and the scattering of the $CO_2$ molecules. The peeled deposit scatters toward the outer side of the wafer and also toward the space above the wafer W. Therefore, it is preferable to supply a purge gas to the surface of the wafer W as will be described in a following specific example. Further, a shielding plate may be provided as will be described in the following specific example. A reference numeral 30 in FIG. 3 indicates $CO_2$ molecules before clustering.

Figure 5:
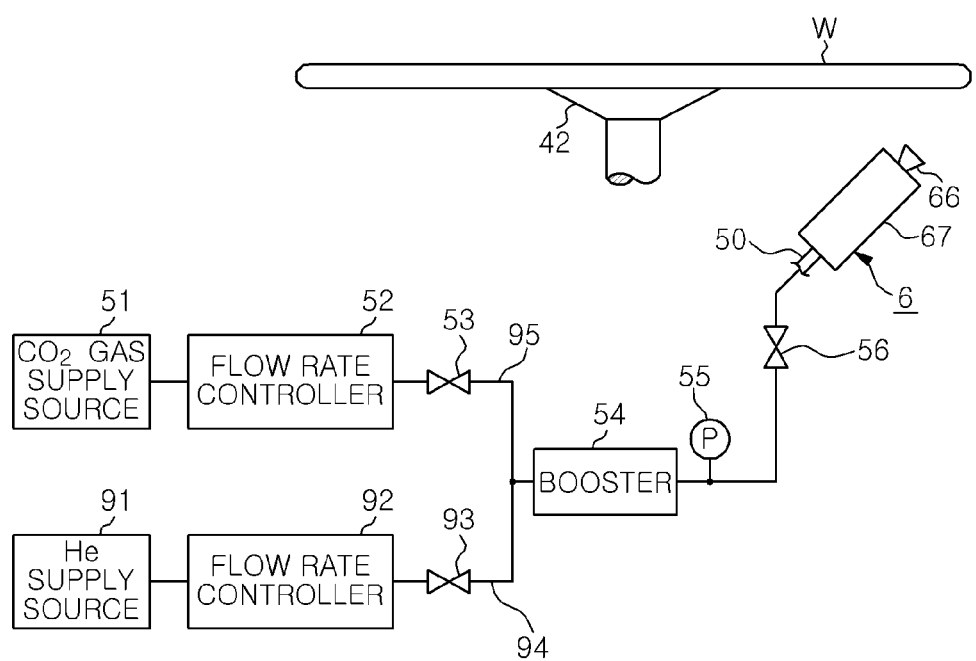
FIG. 5 shows an arrangement for a cleaning method in accordance with another embodiment of the present invention.

In the substrate cleaning apparatus of the present invention, a gas cluster may be generated by supplying He gas in addition to $CO_2$ gas to the nozzle unit 6. For example, as shown in FIG. 5, the pipe of the gas supply line 50 is branched at an upstream side of the booster 54 to be connected to a He supply source 91 through a branch line 94. A flow rate controller 92 and a valve 93 are provided at the branch line 94 from the upstream side thereof. A branch line 95 serves as a branch line for $CO_2$ gas. A mixing ratio of $CO_2$ gas and He gas may be controlled by the flow rate controllers 52 and 92 to, e.g., 1:9. In that case, a pressure in the nozzle unit 6 is set to a pressure slightly lower than the pressure on the vapor pressure line, e.g., 5 MPa, at 20° C. In the case of generating a gas cluster by using $CO_2$ gas mixed with He gas, the ejection speed of the gas cluster can be increased and, thus, a high-energy gas cluster can be obtained, which is preferable.

(First Embodiment)

Figure 6:
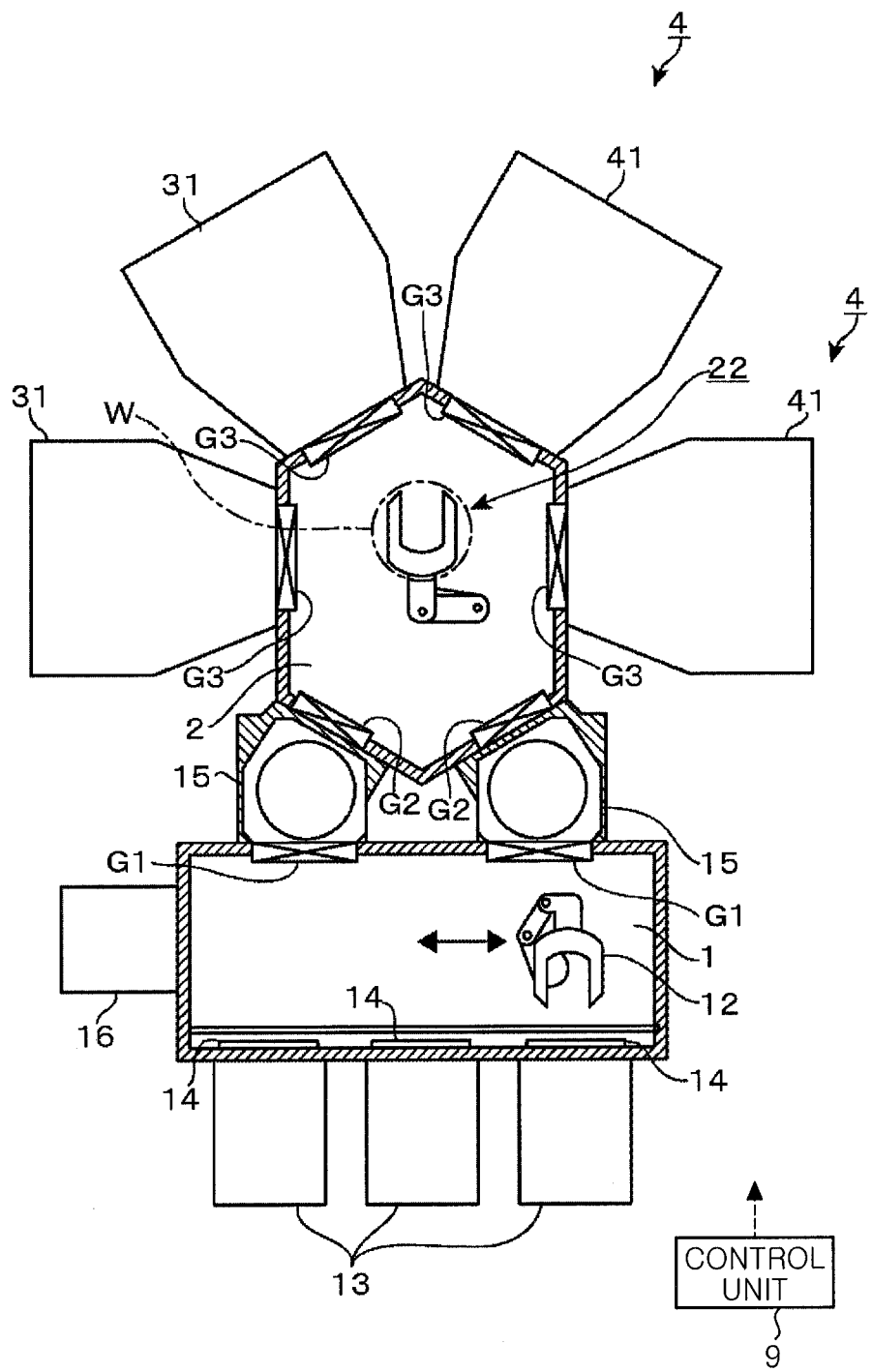
FIG. 6 is a top view showing an entire vacuum processing system in accordance with an embodiment of the present invention.

Next, an example of a specific apparatus for implementing the above-described substrate cleaning method will be described. FIG. 6 shows a vacuum processing system having a substrate cleaning apparatus 4 in accordance with the embodiment of the present invention. The vacuum processing system includes an atmospheric transfer chamber 1 having a rectangular shape when seen from the top. A loading/unloading port for loading/unloading a wafer W is provided at one longitudinal side of the atmospheric transfer chamber 1. The loading/unloading port has a plurality of loading/unloading stages 13, on each of which a FOUP as a transfer container that accommodates a plurality of wafers W is mounted, and a door 14 provided at each of the loading/unloading stage 13.

A vacuum transfer chamber 2 having, e.g., a hexagonal shape when seen from the top, is connected to a side of the atmospheric transfer chamber 1 which is opposite to the side where the loading/unloading stages 13 are provided through a right and a left load-lock chamber 15 (preliminary vacuum chambers). An alignment module 16 having an orienter for adjusting the orientation of the wafer W is connected to a short side of the atmospheric transfer chamber 1. Provided in the atmospheric transfer chamber 1 is a transfer unit 12 for transferring the wafer W among the loading/unloading stages 13, the load-lock chambers 15 and the alignment module 16.

The vacuum transfer chamber 2 is maintained in a vacuum atmosphere by a vacuum pump (not shown). The vacuum transfer chamber 2 is connected to a first vacuum chamber 31 of an etching apparatus in which an etching atmosphere is formed and a second vacuum chamber 41 of a substrate cleaning apparatus 4 in which a cleaning atmosphere is formed. Provided in the vacuum transfer chamber 2 is a transfer mechanism 22 for transferring the wafer W among the load-lock chambers 15, the alignment module 16, the etching apparatus and the substrate cleaning apparatus 4. Notations G1 to G3 in FIG. 6 represent gate valves serving as partition valves.

The vacuum processing system includes a control unit 9. The transfer of the wafer W, the opening/closing of the gate valves G1 to G3 and the doors 14, the processing and the vacuum level in the vacuum chambers 31 and 41 are controlled by software including a processing recipe and a program stored in a storage unit of the control unit 9.

As for the etching apparatus, a known apparatus of a capacitively coupled plasma type, an induction coil plasma type or the like can be used. In the capacitively coupled plasma etching apparatus, an upper electrode and a lower electrode are provided to be opposite to each other in the vacuum chamber 31 and a processing gas is converted into a plasma by applying a high frequency power between both electrodes. The surface of the wafer W is etched by attracting ions in the plasma to the wafer W on the lower electrode by a bias power applied to the lower electrode.

Figure 7:
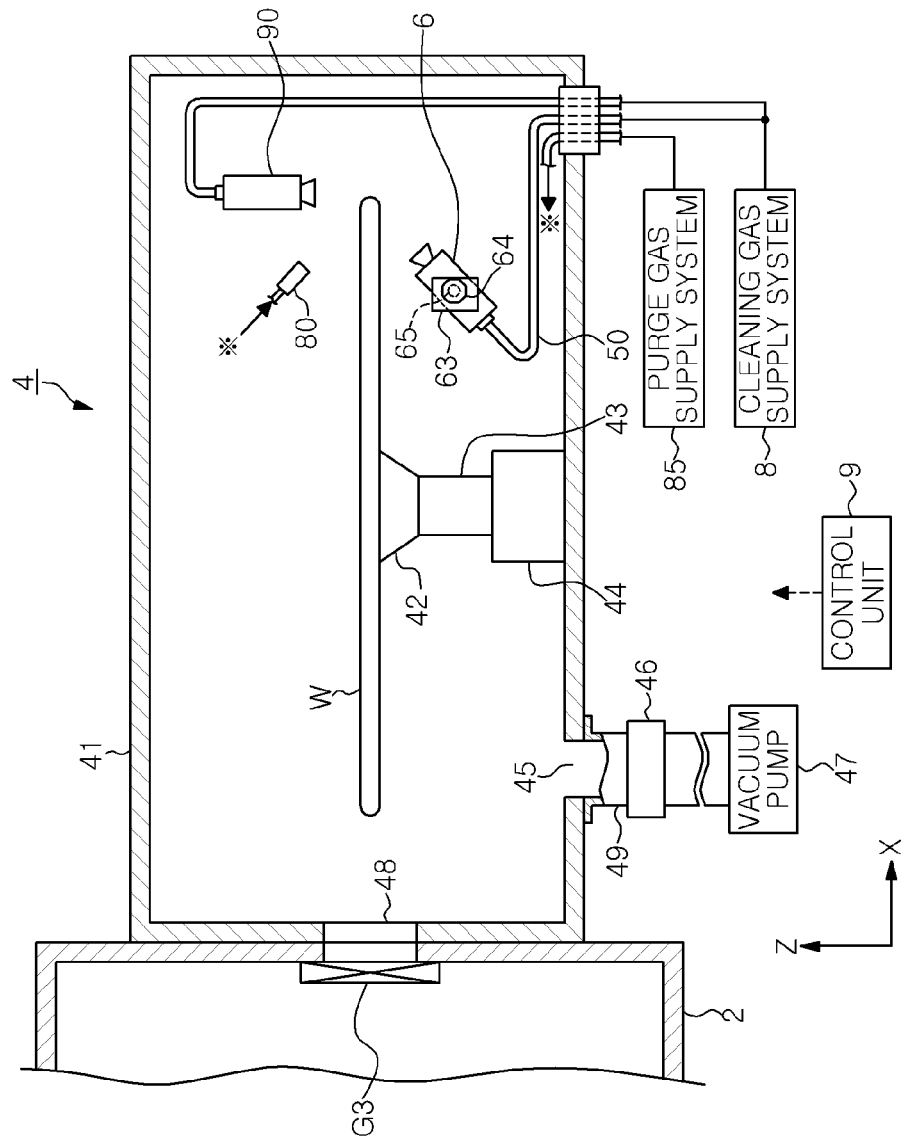
FIG. 7 is a vertical cross sectional side view showing a substrate cleaning apparatus in accordance with a first embodiment of the present invention.
Figure 8:
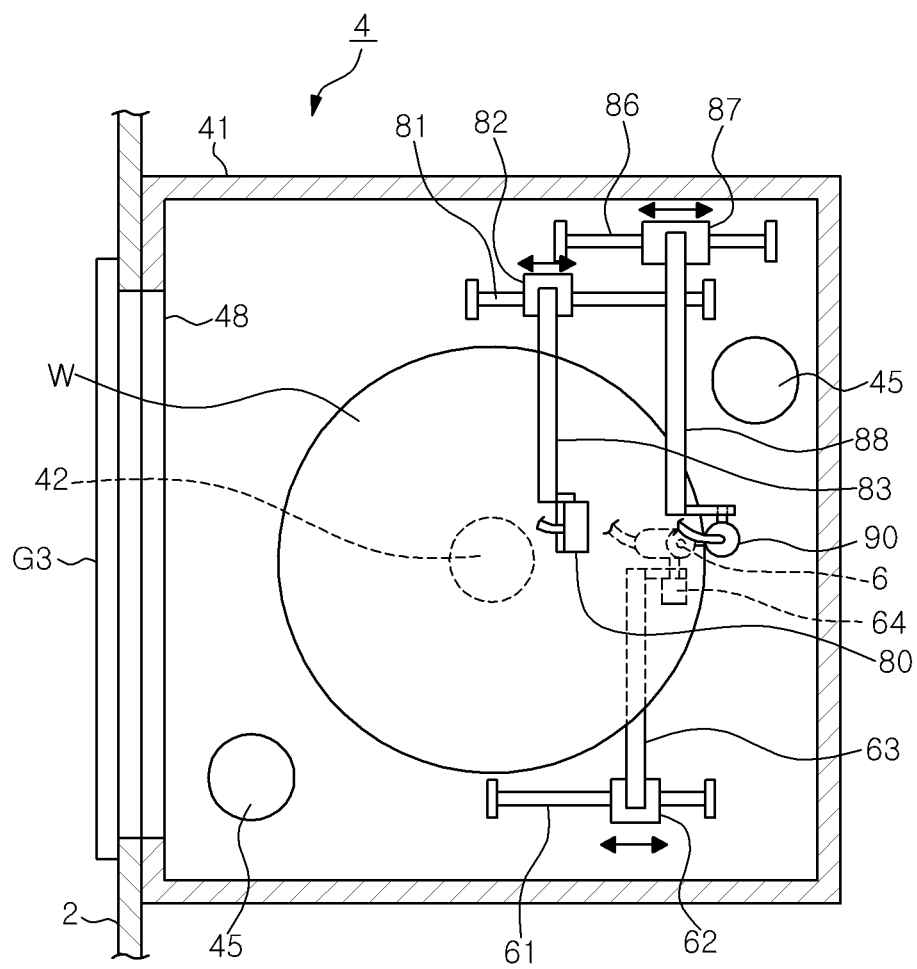
FIG. 8 is a top view showing the substrate cleaning apparatus in accordance with the first embodiment of the present invention.
Figure 8:

As shown in FIGS. 7 and 8, the substrate cleaning apparatus 4 including the second vacuum chamber 41 in which a processing atmosphere is formed has the rotating stage 42 including an electrostatic chuck for supporting the wafer W horizontally. The rotating stage 42 is supported by a rotation unit 44 as a moving unit fixed to the bottom portion of the second vacuum chamber 41 through a rotation shaft 43. The rotating stage 42 can rotate the wafer W attracted and held thereon about a vertical axis.

Figure 9:
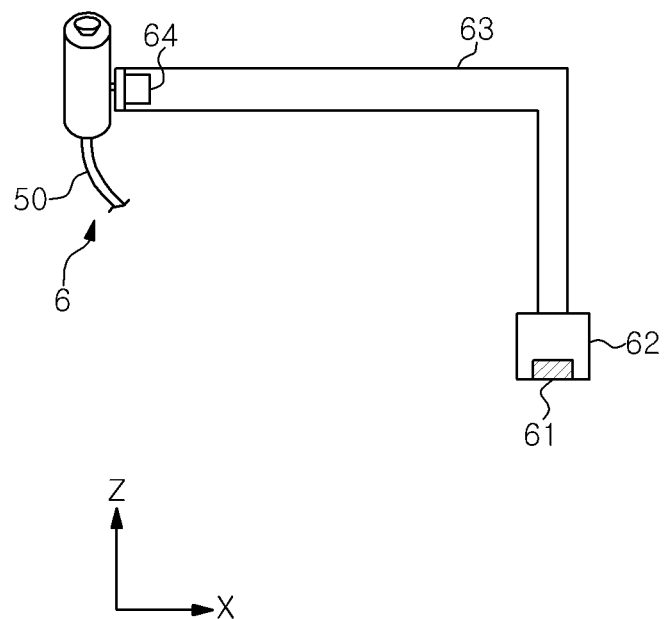
FIG. 9 is a vertical cross sectional side view showing a nozzle unit used for the substrate cleaning apparatus.

A guide rail 61 extending in a horizontal direction (X direction) is provided at the bottom surface of the second vacuum chamber 41. A moving body 62 is driven by a ball screw mechanism (not shown) while being guided by the guide 61. As shown in FIG. 9, a supporting member 63 is provided on the moving body 62 to extend vertically upward (Z direction in the drawing) and then extend in a Y direction in the drawing. A nozzle unit 6 (referred to as "first nozzle unit 6" in this example) connected to the cleaning gas supply system 8 shown in FIG. 1 is provided at a leading end portion of the supporting member 63 through an angle adjusting unit 64.

The first nozzle unit 6 is provided at a position for ejecting a gas cluster to the peripheral portion of the backside of the wafer W held by the rotating stage 42. The angle adjusting unit 64 is configured as a driving unit including a motor having a rotation shaft 65 extending in the Y direction. The first nozzle unit 6 having a main body fixed to the leading end of the rotation shaft 65 so that an ejection angle of a gas cluster can be controlled by rotating the rotation shaft 65 by the angle adjusting unit 64.

Further, a second nozzle unit 90 having the same configuration as the first nozzle unit 6 is provided above the wafer W. The second nozzle unit 90 is configured to eject a gas cluster to an edge portion of the wafer W from above in a vertical direction. Further, the second nozzle unit 90 is connected to a moving body 87 through a supporting member 88. The moving body 87 is fixed to a guide rail 86 provided at the bottom portion of the second vacuum chamber 41 and horizontally movable in the X direction along the guide rail 86. The second nozzle unit 90 is connected to a pipe branched from the cleaning gas supply system 8 and extending in parallel thereto.

As shown in FIG. 7, a purge gas nozzle 80 is provided above the wafer W in the second vacuum chamber 41. The purge gas nozzle 80 is configured to form a flow of a purge gas, e.g., Ar gas, nitrogen gas or the like, at the peripheral portion of the top surface of the wafer W. The purge gas nozzle 80 is connected to a supporting member 83 and a moving body 82 having the same configurations as those of the nozzle unit 6. The moving body 82 is fixed to a guide rail 81 provided at the bottom portion of the second vacuum chamber 41 and horizontally movable in the X direction along the guide rail 81. The purge gas nozzle 80 is connected to a purge gas supply system 85 provided at the outside of the second vacuum chamber 41. The purge gas supply system 85 includes, e.g., a purge gas supply source, a flow rate controller, a valve or the like.

A gas exhaust pipe 49 is connected to a gas exhaust port 45 formed at the bottom portion of the second vacuum chamber 41. A vacuum pump 47 is connected to the gas exhaust pipe 49 via a pressure control unit 46, so that a pressure in the second vacuum chamber 41 can be controlled.

Hereinafter, an operation of the vacuum processing system will be described. First, a transfer container, e.g., a FOUP, accommodating therein wafers W is mounted on the loading/unloading stage 13 and the door 14 opens together with a lid of the transfer container. Next, a wafer W in the transfer container is transferred by the transfer unit 12 in the atmospheric transfer chamber 1 to the alignment module 16 and an orientation of the wafer W is adjusted to a preset orientation. Then, the wafer W is loaded into the first vacuum chamber 31 of the etching apparatus via the transfer unit 12, the load-lock chamber 15, and the transfer mechanism 22 in the vacuum transfer chamber 2.

The wafer W has an organic film, for example, formed thereon and a resist mask formed on the organic film. At the peripheral portion of the wafer W, the resist and the organic film are removed and silicon that is a base of the wafer W is exposed. In the etching apparatus, a recess is formed in a pattern corresponding to the pattern of the resist mask by etching the organic film by a plasma. A deposit that is a reaction by-product or the like generated by the etching is adhered to a beveled portion (peripheral portion) of the backside of the etched wafer W.

Thereafter, the wafer W is loaded into the second vacuum chamber 41 of the substrate cleaning apparatus 4 and rotated by the rotation unit 44 while being attracted and held on the rotating stage 42. A pressure in the second vacuum chamber 41 is maintained in a vacuum atmosphere of, e.g., 1 Pa to 500 Pa, by the pressure control unit 46 and, also, the pressure in the nozzle unit 6 is set to the above-described level. Next, the deposit is removed by ejecting the gas cluster from the nozzle unit 6. As described above, the deposit is separated from the wafer W by the physical impact of the gas cluster of $CO_2$. The separated deposit (reaction by-product) scatters to the outer side of the wafer W by the suction of the vacuum pump 47 and the purge gas ejected from the purge gas nozzle 80 toward the peripheral portion of the surface of the wafer W. The scattered deposit flows toward a position below the wafer W and is discharged to the outside of the second vacuum chamber 41 through the gas exhaust port 45. In this manner, the deposit is removed from the peripheral portion of the wafer W. Upon completion of the cleaning of the peripheral portion of the wafer W, the gate valve G3 is opened and the wafer W is unloaded from the second vacuum chamber 41 by the transfer mechanism 22 of the vacuum transfer chamber 2.

In the above embodiment, a firm $CO_2$ cluster is obtained by controlling a pressure of $CO_2$ gas in the nozzle unit 6 to a pressure slightly lower than a pressure on a vapor pressure line at a temperature in the nozzle unit 6 and the gas cluster thus obtained is ejected to the peripheral portion of the wafer W. Hence, the deposit adhered to the peripheral portion of the wafer W can be reliably removed. Accordingly, the peripheral portion of the wafer W can be effectively cleaned.

In the substrate cleaning apparatus shown in FIG. 7, $CO_2$ gas is supplied to the nozzle unit 6. However, as described with reference to FIG. 5, a gaseous mixture of $CO_2$ gas and He gas may be supplied to the nozzle unit 6. Further, the deposit to be cleaned by the gas cluster is not limited to the deposit adhered to the peripheral portion of the wafer W and may also be a deposit adhered to the backside of the wafer W. The deposit adhered to the backside of the wafer W may include a deposit transferred from the electrostatic chuck during the contact with the electrostatic chuck or a film (deposit) formed on the backside of the wafer W by a film forming gas flowing into the space between the wafer W and the electrostatic chuck supporting the backside of the wafer W during film formation on the wafer W.

The vacuum processing system in accordance with the present invention is not limited to the etching apparatus and may also be an apparatus including a vacuum processing apparatus (vacuum processing module) such as a film forming apparatus or the like.

The substrate to be processed is not limited to a circular substrate such as a wafer W and may also be a polygonal substrate, e.g., a substrate for use in flat panel display (FPD) or the like. In this case, the substrate cleaning process can be performed by relatively moving the nozzle units 6 and 90 and the purge gas nozzle 80 with respect to the substrate from one end to the other end along the periphery thereof.

(Second Embodiment)

Figure 10:
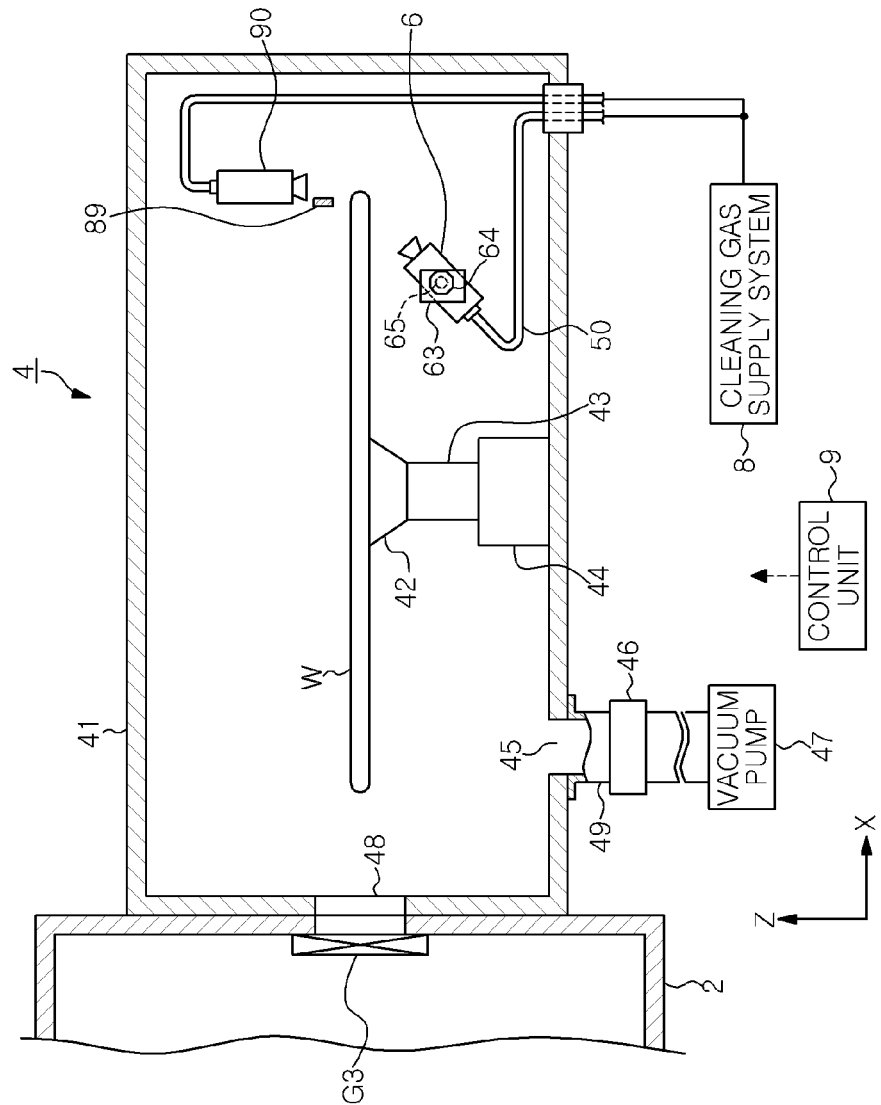
FIG. 10 is a vertical cross sectional side view showing a substrate cleaning apparatus in accordance with a second embodiment of the present invention.
Figure 11:
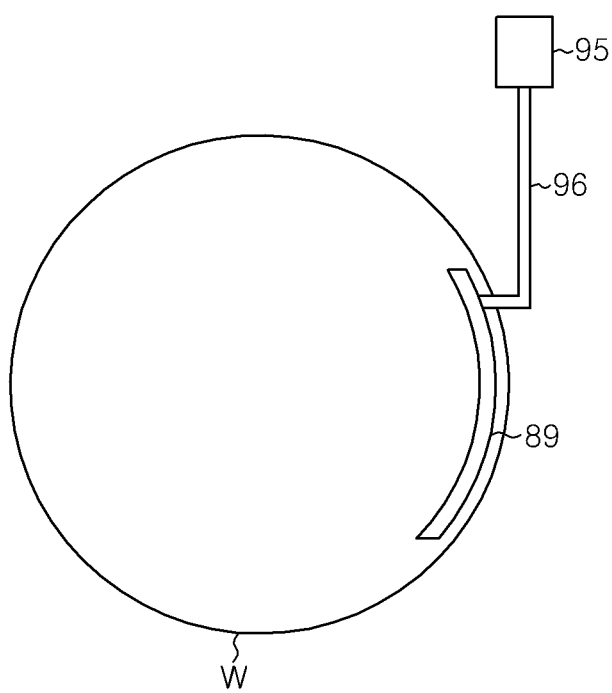
FIG. 11 is a top view showing a shielding plate in accordance with the second embodiment of the present invention.

As shown in FIGS. 10 and 11, a shielding plate 89 as a shielding member is provided at a side of the surface of a wafer W to prevent a broken deposit from adhering to the surface of the wafer W. The shielding plate 89 is a vertically standing plate and has an arc shape curved along the peripheral portion of the wafer W when seen from the top. The shielding plate 89 is provided at a position shifted toward the center from the outer periphery (outermost line of the peripheral portion) of the wafer W mounted on the rotating stage 42 along the peripheral portion thereof. The wafer W is located at a height position (processing position) with a gap from the shilding plate 89 during the cleaning using a gas cluster. The shielding plate 89 is configured to be vertically movable by an elevation unit 95 provided in the second vacuum chamber 41 through a supporting arm 96, between the processing position and a retreat position where the shielding plate 89 does not interfere with the transfer unit in the second processing chamber 41 during the transfer of the wafer W.

Figure 12:
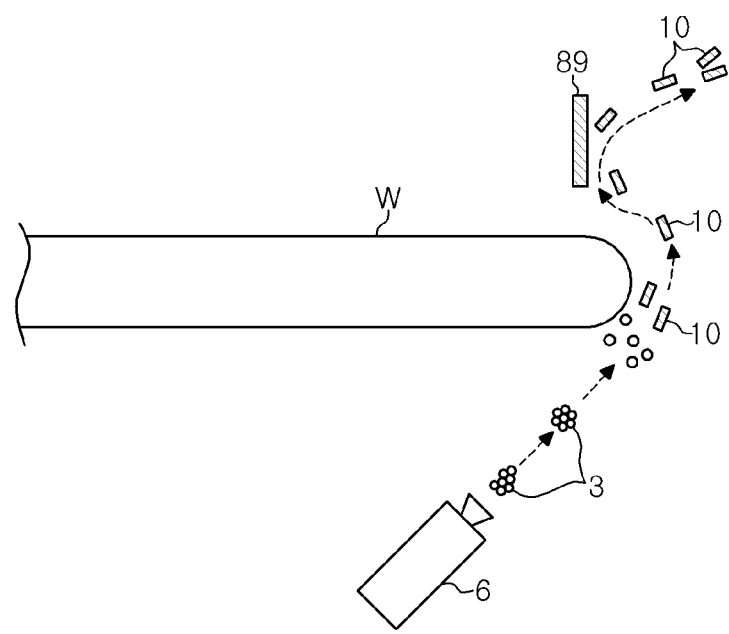
FIG. 12 is an explanatory view showing a structure for preventing re-adhesion of the deposit removed by the gas cluster.

Next, an operation in accordance with the second embodiment will be described. FIG. 12 shows scattering of deposits in the case of ejecting a gas cluster from the first nozzle unit 6 provided below the wafer W. For example, in the case of ejecting a gas cluster to a wafer W at an angle of 45° with respect to the backside of the wafer W, the deposits 10 are broken by the gas cluster 3 and scatter.

A part of the scattering deposits 10 may move toward the surface of the wafer W along the peripheral portion thereof. Since, however, the shielding plate 89 is provided, the scattering substances are blocked or bounced by the shielding plate 89 and moved toward the outer side of the wafer W.

Further, the second vacuum chamber 41 is vacuum-evacuated through the gas exhaust port 45 formed at the bottom portion, so that the scattering substances are moved toward the gas exhaust port 45. Hence, the deposits 10 peeled from the peripheral portion of the wafer W are prevented from being re-adhered to the surface of the wafer W.

The first nozzle unit 6 and the second nozzle unit 90 are installed such that the gas clusters are ejected from different positions onto the wafer W along the circumferential direction and do not interfere with each other in the case of ejecting the gas clusters from the first nozzle unit 6 and the second nozzle unit 90 simultaneously. The gas clusters may be ejected from the first nozzle unit 6 and the second nozzle unit 90 at different timings. For example, after rotating the wafer W by 360° while a gas cluster is ejected from the second nozzle unit 90, the ejection from the second nozzle unit 90 is stopped and a gas cluster is ejected from the first nozzle unit 6 while the wafer W is rotated by 360°.

Both of the purge gas nozzle 80 of the first embodiment and the shielding plate 89 of the second embodiment may be employed so that the present invention can realize both of the effect of moving the deposit peeled from the peripheral portion of the wafer W to the outer side of the wafer W by the purge gas and the effect of preventing the deposit from moving toward the surface of the wafer W by the shielding plate 89.

TEST EXAMPLES

Test Example 1

Figure 13:
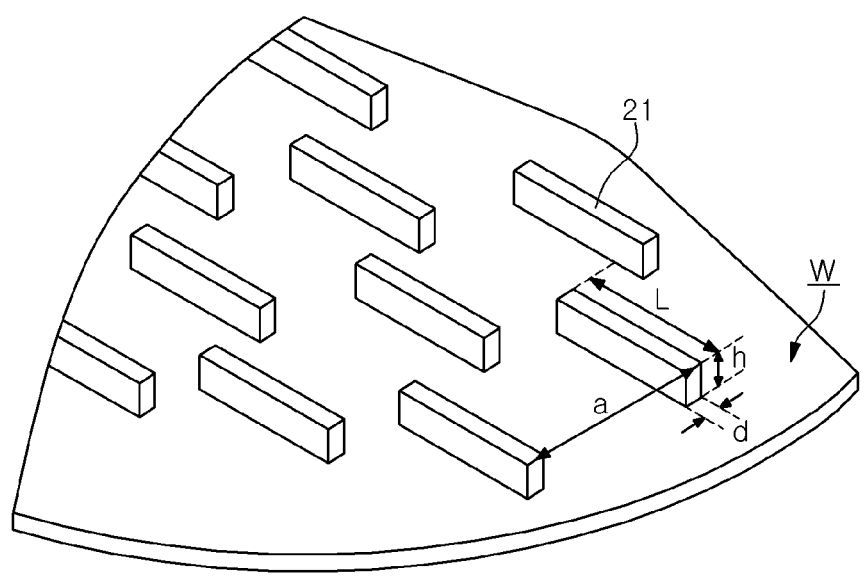
FIG. 13 is a perspective view showing a polysilicon pattern formed on a bare silicon wafer.

A pattern group was formed on a surface of a bare silicon wafer. As shown in FIG. 13, the pattern group includes rectangular polysilicon patterns arranged in a zigzag shape and spaced apart from each other at an interval "a" of 500 nm in a width direction, each pattern having a height "h" of 100 nm, a width "d" of 45 nm and a length L of 600 nm. The nozzle unit 6 was provided immediately above the pattern group so that the axis thereof is perpendicular to the surface of the wafer W. A gas cluster of $CO_2$ was ejected from the nozzle unit 6 to the pattern group. A distance between the orifice of the nozzle unit 6 and the pattern group (the wafer surface) was 1 cm. A temperature in the nozzle unit 6 was set to 20° C. A pressure was varied to 3 MPa, 4 MPa and 5 MPa.

Figure 14:
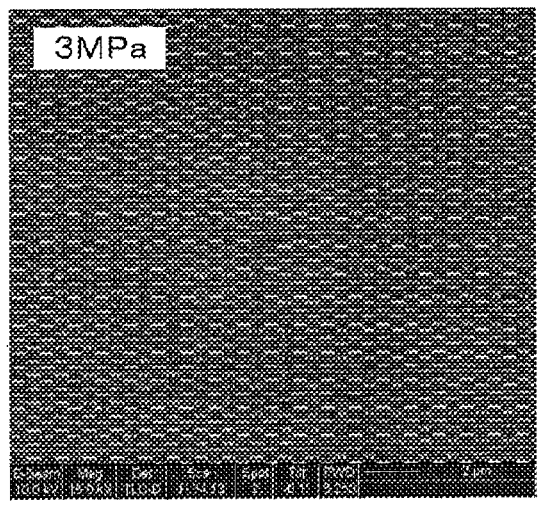
FIG. 14 is an SEM image showing a state obtained when the gas cluster is ejected to the polysilicon pattern in a test example.
Figure 15:
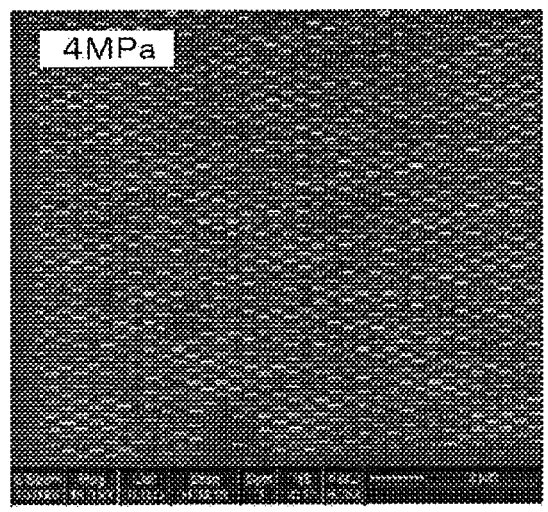
FIG. 15 is an SEM image showing a state obtained when the gas cluster is ejected to the polysilicon pattern in the test example.
Figure 16:
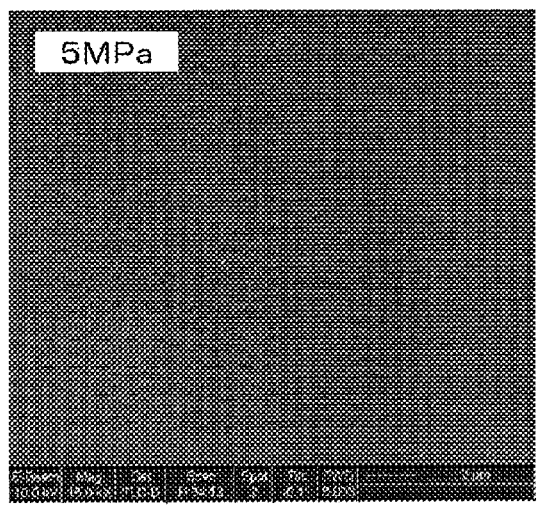
FIG. 16 is an SEM image showing a state obtained when the gas cluster is ejected to the polysilicon pattern in the test example.

FIGS. 14 to 16 illustrate SEM images showing the state of the pattern group after the ejection of the gas cluster at the respective pressures. When the pressure in the nozzle unit 6 (pressure on the primary side of the orifice) was 3 MPa, the pattern did not collapse. When the pressure was 4 MPa, the tilt ratio of the pattern was 5% and the pattern hardly collapsed. When the pressure was 5 MPa, the tilt ratio of the pattern was 100%.

Figure 17:
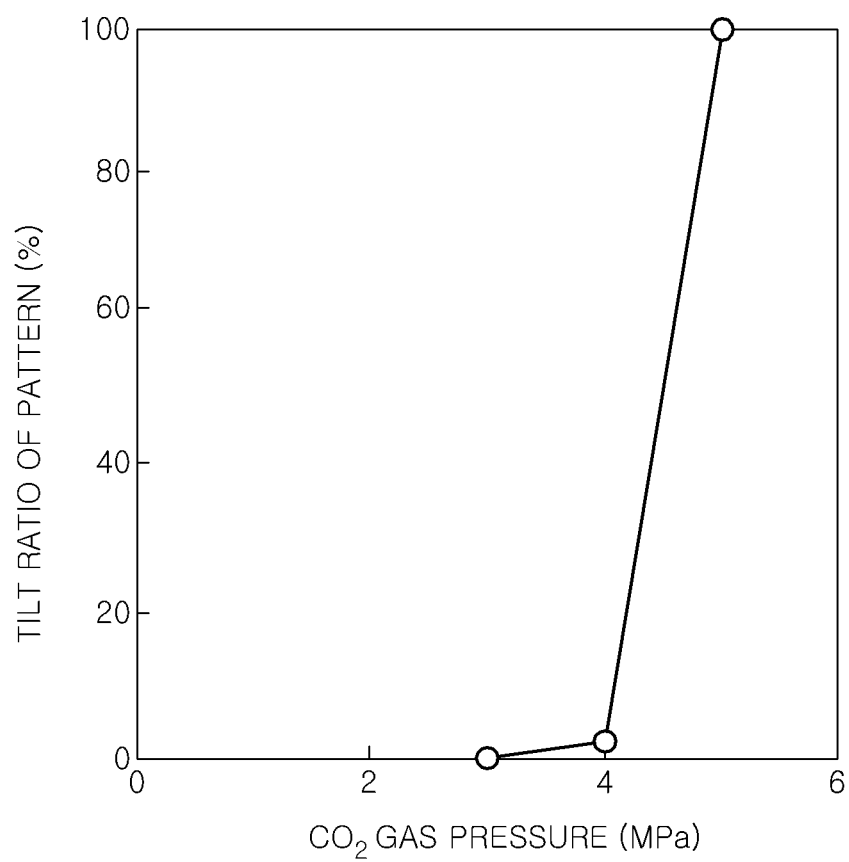
FIG. 17 is a graph showing the characteristics of relation between a pressure of $CO_2$ gas and a tilt ratio of a mask pattern.

FIG. 17 shows relation between the pressure in the nozzle unit 6 and the tilt ratio of the pattern. It is clear from the result that the tilt ratio of the pattern is considerably increased as the pressure of $CO_2$ gas becomes closer to the pressure on the gas-liquid boundary line. Therefore, as described above, the pressure at which a firm gas cluster is obtained, i.e., the pressure slightly lower than the pressure on the vapor pressure line at a temperature of $CO_2$ gas of the present invention, is determined by monitoring the state of the pattern in the case of ejecting the gas cluster to the pattern, for example.

Test Example 2

In order to evaluate the present invention, the following test was conducted by using the substrate cleaning method in accordance with the above-described embodiment.

First, a resist film that is an organic film was formed on the wafer W. Then, the wafer W was etched by a plasma. Next, the state of the peripheral portion of the wafer W in the case of ejecting a $CO_2$ cluster to the backside (peripheral portion) of the wafer W (diameter 30 cm) (test example) was compared with the state of the peripheral portion of the wafer W in the case of ejecting no $CO_2$ cluster thereto (comparative example).

Figure 18:
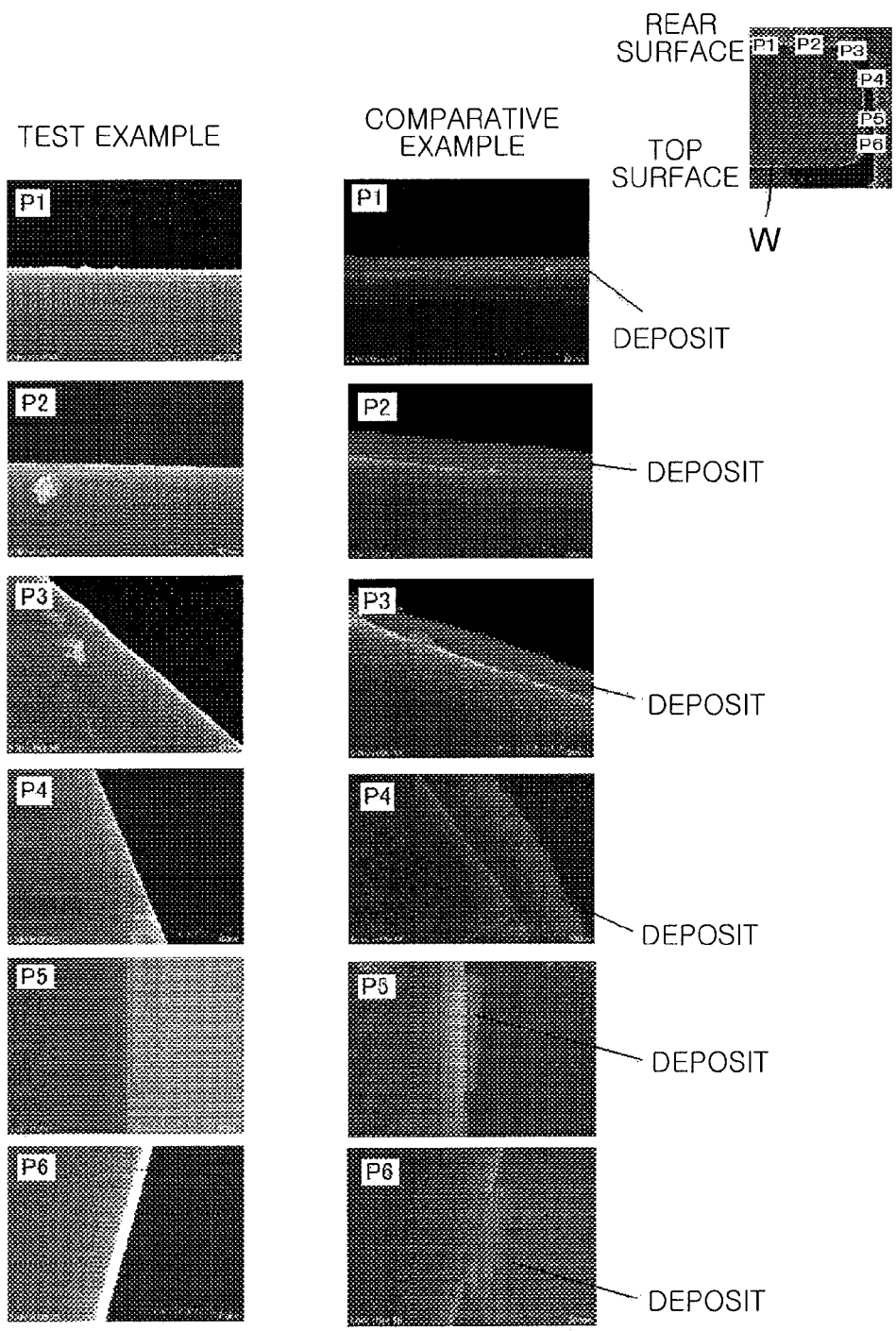
FIG. 18 is an SEM image showing an effect of ejection of the gas cluster to a wafer in the test example.

The $CO_2$ gas was supplied into the nozzle unit 6 at a pressure of 5 MPa under the atmospheric temperature of 20° C. A pressure in the second vacuum chamber 41 was set to 30 Pa. The gas cluster was ejected to the wafer W at an angle of 90°. FIG. 18 shows a result of monitoring the SEM images of portions P1 to P6 of the peripheral portion of the wafer W in the test example and the comparative example. P1 and P2 were set to backside portions of the wafer W. P3 and P4 were set to beveled portions. P5 and P6 were set to side surface portions.

In the wafer W of the comparative example, the deposit was adhered to the beveled portions P3 and P4 or the side surface portions P5 and P6 with a thickness of about 300 nm.

The deposit was also monitored at the backside portions P1 and P2. On the other hand, in the wafer W of the test example, the deposit was not adhered to the backside portions P1 and P2 and hardly remained at the beveled portions P3 and P4 and the side surface portions P5 and P6. From the above, it is clear that the deposit is easily adhered to the beveled portion or the side surface portion of the wafer W and the deposit adhered to the peripheral portion of the wafer W can be reliably removed by the substrate cleaning method of the present invention.

What is claimed is:
1. A substrate cleaning method for removing a deposit adhered to a backside or a peripheral portion of a substrate, the substrate cleaning method comprising:
supporting a substrate by a support;
adjusting and maintaining a pressure in a processing chamber to be a vacuum atmosphere;

adjusting and maintaining a pressure inside a nozzle unit to be higher than the pressure in the processing chamber; and ejecting a cleaning gas containing a carbon dioxide gas to the backside or the peripheral portion of the substrate from the nozzle unit as an aggregate of atoms or molecules of carbon dioxide gas through adiabatic expansion to remove the deposit from the backside or the peripheral portion of the substrate, wherein the pressure inside the nozzle unit is set to be slightly lower than a pressure on a vapor pressure line of carbon dioxide at a temperature of the cleaning gas in the nozzle unit, so that a gas cluster is generated in a solidified state, and wherein the pressure inside the nozzle unit is higher than or equal to 75% and lower than 100% of the pressure on the vapor pressure line of carbon dioxide.

2. The substrate cleaning method of claim 1, wherein the cleaning gas further contains helium gas.

3. The substrate cleaning method of claim 2, wherein a flow rate of the helium gas is greater than that of the carbon dioxide gas.

4. The substrate cleaning method of claim 3, wherein a flow rate ratio of the carbon dioxide gas to the helium gas is 1:9.

5. The substrate cleaning method of claim 1 further comprising:

supplying a purge gas from a side of a top surface of the substrate to the top surface of the substrate when ejecting the gas cluster to the backside or the peripheral portion of the substrate.

6. The substrate cleaning method of claim 1, wherein removing the deposit by ejecting the gas cluster to the backside or the peripheral portion of the substrate is performed in a state where a shield member is provided at a position shifted toward a center from an outer periphery on a top surface of the substrate while being separated from the substrate with a gap to suppress adhesion of the deposit peeled from the substrate to the top surface of the substrate.

7. The substrate cleaning method of claim 1, wherein the substrate has a circular shape and the gas cluster is ejected to the backside or the peripheral portion of the substrate during rotation of the support.

8. A substrate cleaning apparatus comprising:

a support disposed in a processing chamber having a gas exhaust port and configured to support a substrate;

a nozzle unit configured to eject a gas cluster to a backside or a peripheral portion of the substrate to remove a deposit adhered to the backside or the peripheral portion of the substrate being supported by the support;

a gas supply unit configured to supply a cleaning gas containing carbon dioxide gas to the nozzle unit;

a pressure controller configured to control a pressure in the nozzle unit;

a moving mechanism configured to relatively move the nozzle unit and the support, and a control unit programmed to control the pressure controller and configured to:

set a pressure in the processing chamber to be a vacuum atmosphere; and set a pressure inside the nozzle unit to be (1) slightly lower than a pressure on a vapor pressure line of carbon dioxide at a temperature of the cleaning gas in the nozzle unit and (2) higher than or equal to 75% and lower than 100% of the pressure on the vapor pressure line of carbon dioxide to generate the gas cluster in a solidified state.

9. The substrate cleaning apparatus of claim 8, wherein the cleaning gas further contains helium gas.

10. The substrate cleaning apparatus of claim 9, wherein a flow rate of the helium gas is greater than that of the carbon dioxide gas.

11. The substrate cleaning apparatus of claim 10, wherein a flow rate ratio of the carbon dioxide gas to the helium gas is 1:9.

12. The substrate cleaning apparatus of claim 8, further comprising a purge gas supply unit configured to supply a purge gas from a side of a top surface of the substrate to the top surface of the substrate when the gas cluster is ejected to the backside or the peripheral portion of the substrate.

13. The substrate cleaning apparatus of claim 8, further comprising a shielding member disposed at a position shifted toward a center from an outer periphery on a top surface of the substrate while being separated from the substrate with a gap to suppress adhesion of the deposit peeled from the substrate to the top surface of the substrate.

14. The substrate cleaning apparatus of claim 8, wherein substrate has a circular shape, and further comprising a rotation unit to rotate the substrate about a center of the substrate by the support.

15. A vacuum processing system comprising:

a vacuum transfer chamber configured to transfer a substrate under a vacuum atmosphere;

a vacuum processing module coupled to the vacuum transfer chamber through a partition valve and configured to perform vacuum processing on the substrate, the vacuum processing module being an etching apparatus or a film forming apparatus; and the substrate cleaning apparatus of claim 8 coupled to the vacuum transfer chamber through a partition valve and configured to clean at least one of the backside and the peripheral portion of the substrate that has been subject to the vacuum processing in the vacuum processing module.

* * * * *